United States Patent

Kashiwase et al.

[11] Patent Number: 5,378,317
[45] Date of Patent: Jan. 3, 1995

[54] METHOD FOR REMOVING ORGANIC FILM

[75] Inventors: Masaharu Kashiwase; Terumi Matsuoka, both of Okayama, Japan

[73] Assignee: Chlorine Engineers Corp., Ltd., Tokyo, Japan

[21] Appl. No.: 110,646

[22] PCT Filed: Oct. 9, 1991

[86] PCT No.: PCT/JP91/01374

§ 371 Date: Jun. 8, 1992

§ 102(e) Date: Jun. 8, 1992

[87] PCT Pub. No.: WO92/06489

PCT Pub. Date: Apr. 16, 1992

Related U.S. Application Data

[63] Continuation-in-part of Ser. No. 853,702, Jun. 8, 1992, abandoned.

[30] Foreign Application Priority Data

Oct. 9, 1990 [JP] Japan ................ 2-270898

[51] Int. Cl.⁶ .......................... H01L 21/312
[52] U.S. Cl. ............................... 156/659.1
[58] Field of Search ..................... 156/659.1

[56] References Cited

U.S. PATENT DOCUMENTS

| | | | |
|---|---|---|---|
| 4,006,040 | 2/1977 | Cline et al. | 437/14 |
| 4,519,846 | 5/1985 | Aigo | 134/15 |
| 4,749,640 | 6/1988 | Tremont et al. | 437/946 |
| 4,938,839 | 7/1990 | Fujimura et al. | 437/229 |
| 5,049,519 | 9/1991 | Teng | 437/57 |
| 5,102,629 | 4/1992 | Hayashi et al. | 422/186.18 |

FOREIGN PATENT DOCUMENTS

| | | |
|---|---|---|
| 213127 | 9/1987 | Japan . |
| 8630 | 1/1989 | Japan . |
| 76726 | 3/1989 | Japan . |

*Primary Examiner*—Robert Kunemund
*Assistant Examiner*—Linda J. Fleck
*Attorney, Agent, or Firm*—Armstrong, Westerman, Hattori, McLeland & Naughton

[57] ABSTRACT

The method for removing organic film according to the present invention is very effective for removing a photo resist film in a process for manufacturing semiconductor device. A substrate (32) having a photo resist film (31) formed on it is processed in a wet processing tank (34) filled with a processing solution such as a mixed solution containing sulfuric acid and hydrogen peroxide or by a dry processing using oxygen plasma. Then, it is processed in an ozone processing tank (34) filled with a solution where ozone or ozone water has been infused, and the organic film is removed.

4 Claims, 3 Drawing Sheets

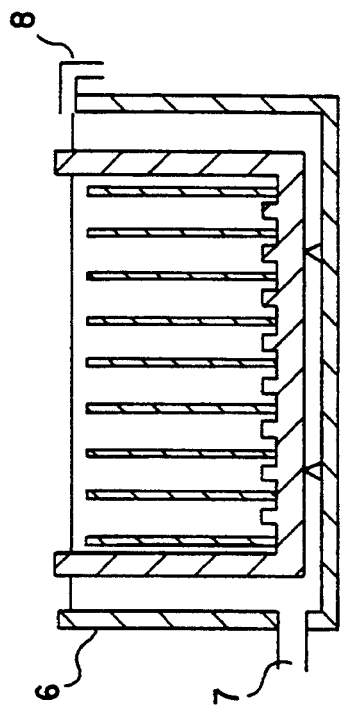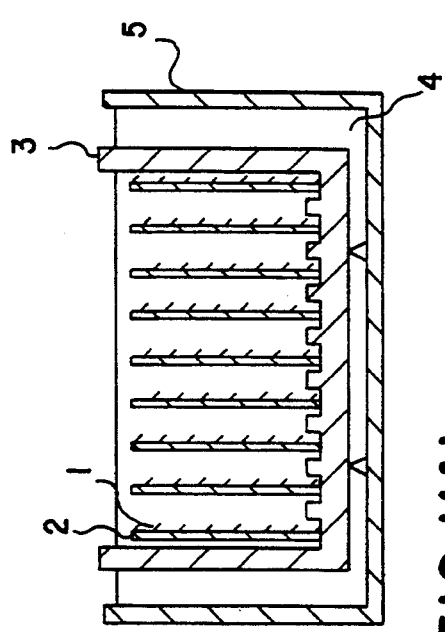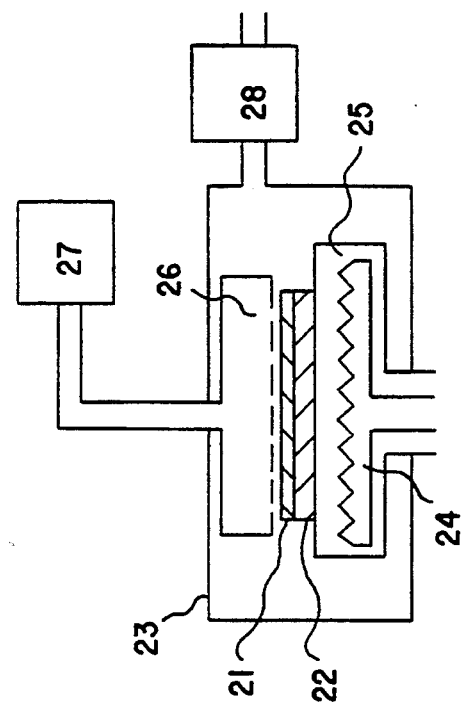
FIG.1(A)
FIG.1(B)
FIG.2

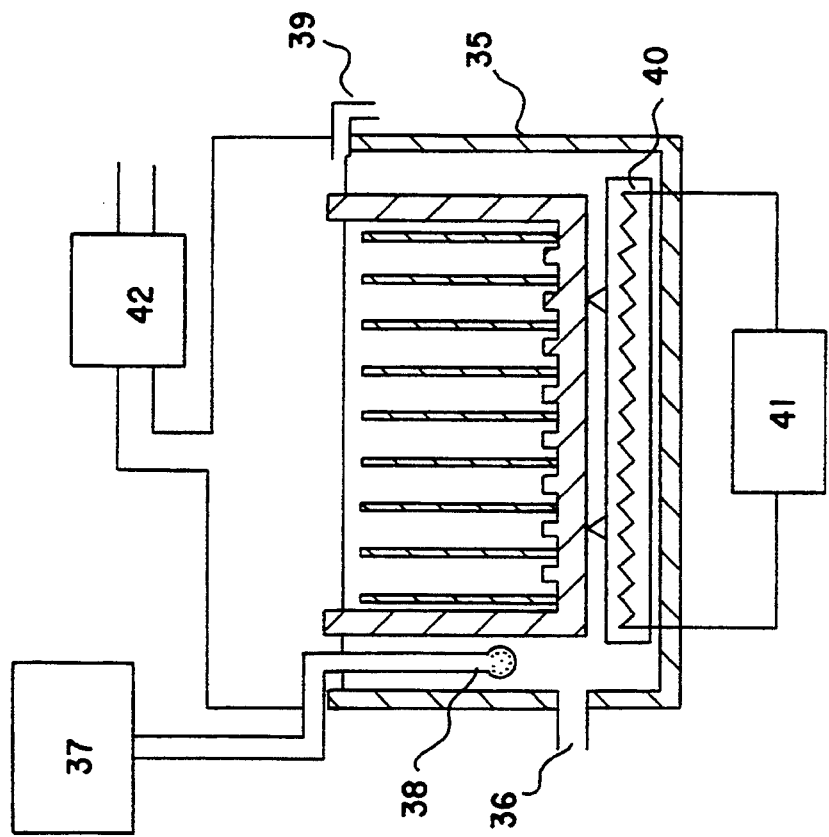
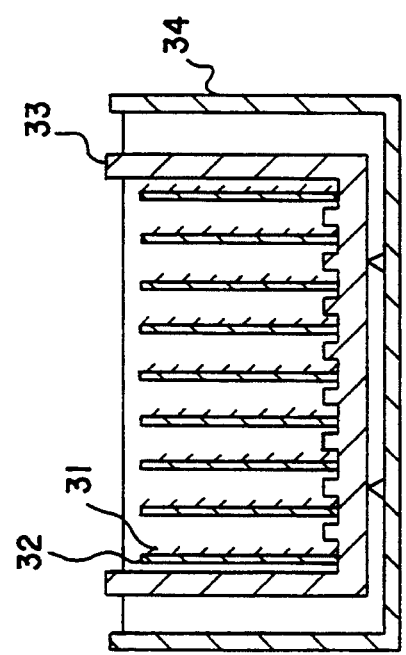
FIG.3(A)
FIG.3(B)

METHOD FOR REMOVING ORGANIC FILM

This application is a continuation-in-part of application Ser. No. 07/853,702 filed Jun. 8, 1992, now abandoned.

FIELD OF THE INVENTION

The present invention relates to a method for removing an organic film, and in particular to a method for removing a photo resist film, i.e. an organic macromolecular compound used in manufacture of semiconductor device by photolithography, without damaging the semiconductor device.

BACKGROUND ART

In a process for manufacturing a semiconductor device such as IC, LSI, etc., an organic photosensitive macromolecular compound is coated on a semiconductor substrate such as silicon or a glass substrate in order to form a fine electric element or circuit, and the compound is exposed to ionizing radiation such an ultraviolet ray through a photo mask where a pattern such as a predetermined circuit is formed. Then, the photo resist is developed, and a positive or negative circuit pattern is prepared on the photo resist on the substrate, and a film is formed on a substrate without the photo resist by CVD, sputtering, etc. Alternatively, chemical etching, RIE (reactive ion etching), diffusion by heating impurity element, or ion implantation are performed. After a series of processings are completed, the film of photo resist on the substrate is removed by chemical processing. In a process for manufacturing IC and LSI, after various processings by coating such photo resist, the photo resist film is removed not only by a single procedure but by several procedures.

To remove the photo resist film, various methods are adopted, and it is necessary to completely remove the photo resist film because the subsequent processes may be affected adversely if the removal of the photo resist is incomplete. Particularly, since the line width of a circuit of a semiconductor device to be formed is finer because of the introduction of higher integration of the semiconductor device in recent years, the influence of residue of the photo resist film becomes larger than is the case with lower integration, and it is necessary to remove it completely.

Various methods are employed for the removal of the photo resist film including a wet method using a chemical solution and a dry method using oxygen plasma.

In the wet method for removing photo resist film, sulfuric acid is normally used, and it is general practice to mix the acid with hydrogen peroxide to increase oxidizing ability of the sulfuric acid.

When the photo resist film is removed using a mixed solution of sulfuric acid and hydrogen peroxide, a chemical solution such as sulfuric acid attached on the film is removed after the removal of the photo resist film, and ultra pure water is used for removing and cleaning the residue.

As is shown in FIG. 1(A), to remove an organic film by a normal wet method, a plurality of wafers 2 with organic films 1 formed thereon are accommodated in a wafer cassette 3, and this is immersed for a certain period time in a processing tank 5 filled with a processing solution 4 such as a mixed solution of sulfuric acid and hydrogen peroxide. Then, the wafer cassette 3 is immersed in a rinse tank 6 with ultra pure water to remove any chemical solution attached on the substrate or residue of the photo resist film. There are many types of rinse tanks, while an overflow type tank is widely used and the rinse tank is provided with an ultra pure water inlet 7 and an outlet 8 for the solution.

In the removal of the photo resist film by the mixed solution of sulfuric acid and hydrogen peroxide, oxidizing decomposition of the photo resist film by oxygen generated through decomposition of hydrogen peroxide plays an important role. To maintain the oxidizing ability of this mxied solution, it is necessary to replenish a new solution by removing sulfuric acid and hydrogen peroxide, which have been consumed by oxidizing decomposition of the photo resist film and have decreased concentration.

A method has been proposed in the Japanese Patent Publication No. 52-12063, by which ozone is supplied to sulfuric acid to remove the photo resist film in order to obtain the same effect without processing of waste solution with its removing ability or without the procedure to replenish the solution.

In the case of a normal photo resist film, it is possible to remove the photo resist film by the introduction of ozone into the sulfuric acid as described above. In some cases, however, when reactive ion etching is performed or high concentration arsenic is used by ion implatation for doping of impurities into the semiconductor, the photo resist film is not removed completely and a residue remains. When high energy ions are used in an ion implantation method, arsenic and others used in the ion implantation may chemically react with the photo resist, and the photo resist film maybe converted into a substance which is not easily oxidized. As a result, oxidizing decomposition is prevented because of the processing solution.

The sulfuric acid used for the processing of the photo resist film has a high concentration, and the ratio of water in the procesing solution of the photo resist film is low. When ozone with lower solubility in sulfuric acid is introduced into the sulfuric acid containing lower ratio of water, ozone is less dissolved into the processing solution. Thus, the introduction of ozone into the processing solution does not necessarily result in effective use of ozone. Accordingly, even when ozone is introduced into sulfuric acid, the oxidizing ability of ozone is not effectively utilized.

On the other hand, in the processing by a chemical solution containing sulfuric acid and hydrogen peroxide or chemical solution with dissolved ozone, various facilities for introducing the chemical solution are required, and also facilities for the processing waste solution are needed. Further, it is necessary to provide a process to remove the chemical solution by completely rinsing with ultra pure water after the processing with the chemical solution.

Under such circumstances, the dry method for processing is now more frequently used instead of the wet processing method using a chemical solution. A typical dry method for removing photo resist film is a method using oxygen plasma. According to this method, oxygen plasma is generated by high frequency energy to oxidize the photo resist film and provides a high oxidizing ability. However, during generation of the plasma, high energy charged particles and ions are generated, and the dielectric breakdown or property of the semiconductor device to be manufactured is impaired, and there is now strong demand on a dry method for removing photo resist without such problems.

To overcome these difficulties, a method is now adopted to separate the plasma generator from the processing unit to remove the organic substance. There is another dry method is adopted to remove the organic film using ozone, which has high oxidizing ability next to fluorine.

FIG. 2 shows the dry method for removing the organic substance by ozone. A wafer 22 such as silicon, where an organic film 21 is formed, is placed on a substrate stage 25 kept at 200° C. to 300° C. by a heating device 24 in a processing unit 23, and a gas containing a high concentration of ozone generated by an ozone generator 27 is injected on the organic film through injection nozzles 26 mounted on upper portion of the processing unit, and the organic film is removed by ozone. To attain uniform processing of the organic film, the substrate stage 25 is rotated. To effectively utilize ozone, which is vulnerable to thermal decomposition, the portions for introducing and injecting ozone are cooled down so that a high concentration ozone can be introduced into the processing unit. To decompose ozone remaining in the gas, which is discharged from the processing unit, an ozone decomposing unit 28 is provided.

The dry processing by ozone is a very effective method which can be conducted without damaging the semiconductor device, and it is possible to remove the photo resist film by the processing using ozone in the case of a normal photo resist film. However, when reactive ion etching is performed or when doping of impurities such as arsenic is carried out at high concentration by ion implantation, the photo resist film is not completely removed and a residue may remain.

Even in such case, it is possible to accomplish the processing by increasing the heating temperature of the substrate stage of the processing unit. However metal such aluminum used in the semiconductor device may undergo unnecessary diffusion by heat and the property of the semiconductor device may be deteriorated. Thus, there is also a problem in the processing at high temperature.

In removing the organic film by oxygen plasma, the processing by plasma for long time may adversely affect the semiconductor device, and there is a problem in processing by oxygen plasma for long period when of an organic film with high ion implantation and with high tolerance to oxygen plasma.

It is therefore an object of the present invention to provide a method, by which it is possible to remove a photo resist film, which is difficult to remove by a wet method using chemical solution, and also to remove a photo resist film, which is deteriorated by ion implantation and is difficult to remove without processing at a high temperature for long time by a dry method, by a processing conducted at a relatively low temperature within a short time and without impairing the semiconductor device.

DISCLOSURE OF THE INVENTION

A photo resist film is processed by immersing it in a mixed solution containing sulfuric acid and hydrogen peroxide according to a normal wet method for removing photo resist film, or by a dry processing using ozone or oxygen plasma performed at relatively low temperature and in relatively short time without impairing semiconductor device. A substrate such as silicon, from which an organic substance is not completely removed, is rinsed by ultra pure water containing ozone in dissolved state or in bubbling state (hereinafter referred as "solution containing ozone). Thus, a photo resist film after ion implantation with residue attached on it, not removable by normal wet type processing or by processing using ozone, can be completely removed.

BRIEF DESCRIPTION OF THE DRAWINGS

FIG. 1 shows a process for removing an organic film by a wet method;

FIG. 2 shows a process for removing an organic substance by a dry method using ozone;

FIG. 3 represents a process for removal by ultra pure water containing ozone after a wet processing using an oxidizing agent of the present invention.

BEST MODE FOR CARRYING OUT THE INVENTION

Figure 4A:
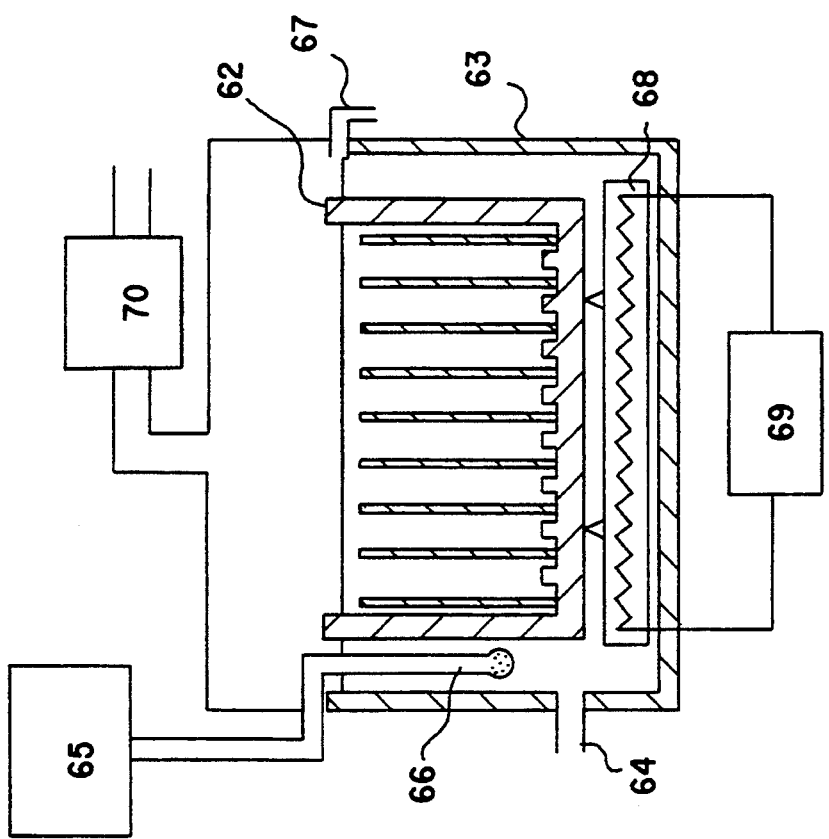
FIG. 4 shows a process for removal by ultra pure water containing ozone after a dry processing of an organic substance using ozone according to the present invention.

According to the present invention, a photo resist film is processed by immersing it in a mixed solution of sulfuric acid and hydrogen peroxide by a normal wet method for removing photo resist film, or a dry processing using oxygen plasma is performed at relatively low temperature and in relatively short time without impairing semiconductor device. Then, a substrate such as silicon, from which an organic substance is not completely removed, is rinsed by a solution containing ozone in dissolved state or in bubbling state (a solution containing ozone), prepared by introducing ozone into ultra pure water. As the result, a photo resist film after ion implantation with residue attached on it, not removable by normal wet type processing or by processing using ozone, can be completely removed.

The processing by ozone is performed by processed water which is prepared by supplying a gas containing ozone into ultra pure water. In supplying ozone into the ultra pure water, not only gaseous ozone obtained from a silent discharge type generator, but also high concentration ozone water, obtained by an electrolysis unit for water, are used, in which high concentration ozone water prepared by dissolving gaseous ozone in ultra pure water in advance or a lead dioxide electrode as anode and a cation exchange membrane of fluororesin type is used as solid macromolecular electrolyte.

To obtain a high concentration ozone in a silent discharge type ozone generator, it is desirable to supply a gas with high oxygen concentration such as pure oxygen to the ozone generator.

Because the photo resist film is oxidized and decomposed in the processing using ozone by the strong oxidizing action of oxygen generated when ozone is decomposed, it is possible to promote the processing of injecting ozone by increasing the temperature of ultra pure water in a processing tank by ozone. In this case, it is preferable to maintain the temperature in the ozone processing tank at 40° C. to 100° C.

If the concentration of the gas containing ozone to be supplied into the ozone processing tank is a higher, higher rinsing effect can be obtained. A porous plate made of glass, ceramics, etc. with many fine pores may be provided on a portion to introduce ozone into the ultra pure water. Thus, it is possible to promote the processing by ozone by promoting of dissolution of the gas containing ozone into the ultra pure water by increasing the contact with the ultra pure water through the formation of fine bubbles by the porous plate. It is preferable that the concentration of ozone in the gas containing ozone to be supplied to the ozone-processing tank is at least about 10,000 ppm or more, more preferably at least about 25,000 ppm or more, most preferably at least about 50,000 ppm ozone or more. In the method for removing organic substances of the present invention, ozone-containing gas in a bubble state or form reaches and contacts the organic film on the substrates in an ozone-processing tank, and provides an extensive effect for removing the organic film by acting on the organic film in that state in the presence of water.

In an ozone-processing tank where bubbles of ozone-containing gas do not exist, if the processed water is heated to an elevated temperature, the ozone cannot remain dissolved in the processed water since the ozone is immediately decomposed, and thus sufficient effect on an organic film by the ozone cannot be obtained. However, in the method of the present invention where an ozone-containing gas in a bubble state is brought to act on the organic film on the substrate, the ozone-containing gas can act on the organic film when the ultra pure water is heated in the ozone-processing tank, and a very high effect on the film can be obtained.

Because ozone has very high oxidizing effect and adversely affects human body, it is necessary to decompose ozone to oxygen by providing an ozone decomposing unit to decompose the discharged ozone from the ozone processing tank.

By the method of the present invention, it is possible to remove the photo resist film of both positive and negative types.

In the following, description will be given on the present invention, with reference to the drawings.

FIG. 3 shows an apparatus to be used for a method for removing a photo resist film in ultra pure water containing ozone after the photo resist film has been processed by a chemical solution. As shown in FIG. 3 (A), a plurality of substrates 32, on which photo resist films 31 are formed, are accommodated in a cassette 33. This cassette 33 is immersed for a certain period of time in a wet processing tank 4, which is filled with a processing solution such as a mixed solution of sulfuric acid and hydrogen peroxide, and the photo resist films are removed by a wet method. Then, the cassette is immersed in an ozone processing tank 35 shown in FIG. 3 (B) and is processed. The ozone processing tank comprises a supply pipe 36 for ultra pure water, an ozone supply pipe 38 for supplying ozone generated in an ozone generator 37, and a solution discharge pipe 39. The temperature of the solution in the ozone processing tank is adjusted to a desired value by a heater 40 and a temperature regulator 41.

To prevent the contamination of the working environment by ozone discharged from the ozone processing tank, an ozone decomposing unit 42 is provided, and the discharge of ozone to the working environment is prevented.

Figure 4B:
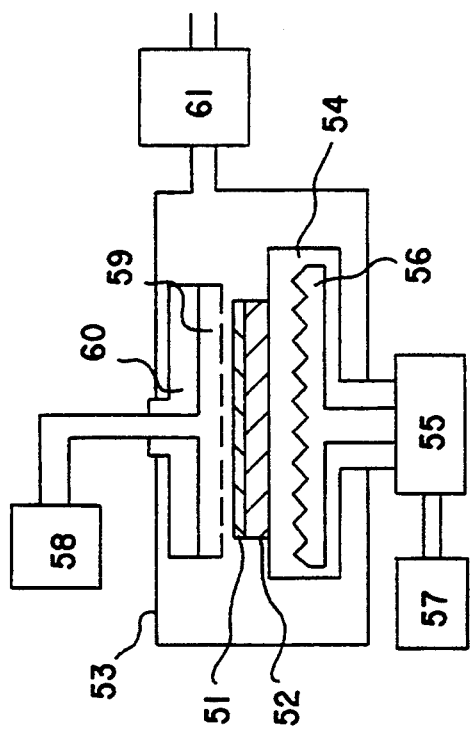

FIG. 4 shows a method for processing photo resist films in ultra pure water containing ozone by injecting ozone after the films have been processed by a dry processing using ozone.

As shown in FIG. 4 (A), a substrate 52 with photo resist film 51 formed on it is placed on a substrate stage 54 in a processing chamber 53. The substrate stage 54 is rotatable by a rotating mechanism 55, and a heating element 56 is furnished in the substrate stage, and the temperature is maintained at a predetermined value by a temperature controller 57.

A gas containing ozone is generated in an ozone generator 58 and is injected through a plurality of injection nozzles 59, placed face-to-face to the substrate, toward the surface of the substrate. To prevent decomposition of the gas containing ozone by heat, a channel toward the processing chamber and the injection nozzles are cooled by a cooling medium 60 so that the gas containing a high concentration ozone can reach the substrate surface uniformly.

In the gas discharged from the ozone processing chamber, unreacted ozone remains together with carbon dioxide generated by decomposed organic substances and water, and this gas cannot be discharged. Thus, it is necessary to discharge the gas after ozone has been completely decomposed by the ozone decomposing unit 61, which comprises an ozone decomposing heater or an ozone decomposing catalyst.

In case the dry processing using ozone is performed by a leaf type processing as in the present embodiment, the processing speed can be substantially increased by furnishing a plurality of processing chambers in a dry processing unit using ozone.

After the processing by ozone has been completed, the substrate 52 is housed in a cassette 62 as shown in FIG. 4 (B) just as in the case of the substrate after the completion of processing by chemical solution. The cassette 62 is then immersed in an ozone processing tank 63, and the residue is removed by water containing ozone.

The ozone processing tank comprises an ultra pure water supply pipe 64, an ozone supply pipe 66 for supplying ozone generated in an ozone generator 65, and a solution discharge pipe 67. The temperature of the solution in the ozone processing tank is regulated to a predetermined value by a heater 68 and a temperature regulator 69.

It is preferable to provide an inlet for the supply pipe 64 of ultra pure water on the lower portion of the ozone processing tank and to provide the solution discharge pipe on the upper portion of the ozone processing tank so that the solution is discharged by overflow.

An ozone decomposing unit 70 is furnished to prevent the contamination of the working environment by ozone discharged from the ozone processing tank.

In the following, the features of the invention will be described referring to several examples.

EXAMPLE 1

On a silicon wafer of 150 mm in diameter, positive type photo resist (OFPR-800; Tokyo Ohka Kogyo Co., Ltd.) was coated in a thickness of 1.5 $\mu$m, and exposure and development were performed. Then, ion implantation was carried out with arsenic at concentration of $1 \times 10^{15}/cm^2$ to $3 \times 10^{15}/cm^2$. The wafer was immersed for 5 minutes in a processing solution which contained sulfuric acid of 90% concentration and hydrogen peroxide of 35% concentration mixed at a ratio of 4:1. Further, the wafer was immersed for 5 minutes at room temperature in ultra pure water with gas containing varying concentrations of ozone and is then rinsed in running ultra pure water.

The removal of photo resist film is not performed uniformly from the wafer Surface but it is influenced by a pattern formed on the photo resist surface. The present inventors studied a method to evaluate the removal of photo resist film and evaluated it by the following method.

The mode of detachment differs according to form, line width, area, etc., and the larger the line width or the area is, the more rarely the detachment occurs. Thus, the pattern was divided into four parts for observation: portion with identification symbol, pad portion, lead portion and wiring portion, with difficulty of detachment in this order. Then, the wiring portion was divided into wiring top and a portion around wiring for observation. The results are summarized in Table 1. A photo resist film completely detached is represented by o, a photo resist film partially remaining is shown by Δ, and a photo resist film not removed is shown by x. Comparison was also made by numerical values with complete removal as 100.

TABLE 1

| Arsenic infusion conc. ($cm^{-2}$) | Ozone conc. (ppm) | Identification symbol | Pad | Lead | Wiring | Overall evaluation of detachment |
| --- | --- | --- | --- | --- | --- | --- |
| $1 \times 10^{15}$ | 95000 | o | o | o | o | 100 |
| $1 \times 10^{15}$ | 57000 | o | o | o | o | 100 |
| $1 \times 10^{15}$ | 41700 | o | o | o | o | 100 |
| $2 \times 10^{15}$ | 95000 | o | o | o | o | 100 |
| $2 \times 10^{15}$ | 57000 | o | o | o | o | 100 |
| $2 \times 10^{15}$ | 41700 | Δ | Δ | Δ | o | 65 |
| $3 \times 10^{15}$ | 95000 | o | o | o | o | 100 |
| $3 \times 10^{15}$ | 57000 | Δ | Δ | Δ | o | 65 |
| $3 \times 10^{15}$ | 41700 | Δ | Δ | Δ | o | 65 |

EXAMPLE 2

Instead of the gas containing ozone supplied to the ozone processing tank, ultra pure water with dissolved ozone was used, and the same processing as in the Example 1 was performed. This was evaluated by the same method as in the Example 1 and the results are shown in Table 2. The ozone concentration in ultra pure water was expressed as ozone water concentration in Table 2.

TABLE 2

| Arsenic infusion conc. ($cm^{-2}$) | Ozone water conc. (ppm) | Identification symbol | Pad | Lead | Wiring | Overall evaluation of detachment |
| --- | --- | --- | --- | --- | --- | --- |
| $1 \times 10^{15}$ | 21.8 | o | o | o | o | 100 |
| $2 \times 10^{15}$ | 23.9 | o | o | o | o | 100 |
| $3 \times 10^{15}$ | 23.3 | Δ | o | o | o | 95 |

EXAMPLE 3

By varying the temperature of ultra pure water in the ozone processing tank, processing was performed by the same procedure as in the Example 1 except that the gas containing ozone was injected. The results are summarized in Table 3.

TABLE 3

| Arsenic infusion conc. ($cm^{-2}$) | Liquid temperature (°C.) | Ozone conc. (ppm) | Identification symbol | Pad | Lead | Wiring | Overall evaluation of detachment |
| --- | --- | --- | --- | --- | --- | --- | --- |
| $3 \times 10^{15}$ | 25 | 57000 | Δ | Δ | Δ | o | 65 |
| $3 \times 10^{15}$ | 35 | 57000 | Δ | Δ | Δ | o | 65 |
| $3 \times 10^{15}$ | 50 | 57000 | Δ | o | o | o | 95 |
| $3 \times 10^{15}$ | 100 | 57000 | o | o | o | o | 100 |

EXAMPLE 4

The processing was performed only by the mixed solution of sulfuric acid and hydrogen peroxide and not by ozone, and the removal of the photo resist was evaluated by the same method as in the Example 1. The results are shown in Table 4.

TABLE 4

| Arsenic infusion conc. ($cm^{-2}$) | Identification symbol | Pad | Lead | Wiring | Overall evaluation of detachment |
| --- | --- | --- | --- | --- | --- |
| $1 \times 10^{15}$ | o | o | o | o | 100 |
| $1 \times 10^{15}$ | o | o | o | o | 100 |
| $2 \times 10^{15}$ | Δ | Δ | Δ | Δ | 100 |
| $2 \times 10^{15}$ | Δ | Δ | Δ | o | 100 |
| $3 \times 10^{15}$ | Δ | Δ | Δ | o | 100 |
| $3 \times 10^{15}$ | Δ | Δ | Δ | o | 65 |
| $3 \times 10^{15}$ | Δ | Δ | Δ | o | 65 |

EXAMPLE 5

On a silicon wafer of 150 mm in diameter, positive type photo resist (OFPR-800; Tokyo Ohka Kogyo Co., Ltd.) was coated in thickness of 1.5 μm, and exposure and development were performed. Then, ion implantation was performed with arsenic at concentration of $1 \times 10^{15}/cm^2$ to $4 \times 10^{15}/cm^2$. The wafer was placed on a substrate stage in a dry ozone processing unit. With the substrate stage maintained at 300° C., oxygen containing ozone at concentration of 60,000 ppm was supplied from injection nozzles at a flow rate of 10 liters/min. for 2 minutes.

In the ozone processing tank with the gas containing ozone at concentration of 95,000 ppm in ultra pure water, rinsing was performed for 5 minutes when arsenic concentration was $3 \times 10^{15}/cm^2$, and for 6 minutes when it was $4 \times 10^{15}/cm^2$. This was evaluated by the same procedure as in the Example 1, and the results are shown in Table 5.

TABLE 5

| Arsenic infusion conc. ($cm^{-2}$) | Liquid temperature (°C.) | Ozone conc. (ppm) | Identification symbol | Pad | Lead | Wiring | Overall evaluation of detachment |
| --- | --- | --- | --- | --- | --- | --- | --- |
| $1 \times 10^{15}$ | 25 | 95000 | o | o | o | o | 100 |
| $2 \times 10^{15}$ | 25 | 95000 | o | o | o | o | 100 |
| $3 \times 10^{15}$ | 25 | 95000 | o | o | o | o | 100 |
| $4 \times 10^{15}$ | 25 | 95000 | o | o | o | o | 100 |

EXAMPLE 6

Ion implantation was performed by the same procedure as in the Example 5 on a silicon wafer with arsenic at concentration of $3 \times 10^{15}/cm^2$ and $4 \times 10^{15}/cm^2$, and the wafer was immersed for 5 minutes in a processing solution containing sulfuric acid of 90% concentration and hydrogen peroxide of 35% concentration mixed at a ratio of 4:1. Then, the wafer was immersed in an ozone processing solution of ultra pure water containing ozone for 5 minutes when the arsenic concentration was $3 \times 10^{15}/cm^2$ and for 6 minutes when the arsenic concentration was $4 \times 10^{15}/cm^2$ and this was rinsed for 5 minutes under running ultra pure water.

The removal of the photo resist was evaluated by the same procedure as in the Example 5, and the results are given in Table 6.

TABLE 6

| Arsenic infusion conc. ($cm^{-2}$) | Liquid temperature (°C.) | Ozone conc. (ppm) | Identification symbol | Pad | Lead | Wiring | Overall evaluation of detachment |
|---|---|---|---|---|---|---|---|
| $3 \times 10^{15}$ | 25 | 95000 | o | o | o | o | 100 |
| $4 \times 10^{15}$ | 25 | 95000 | Δ | Δ | Δ | o | 60 |

INDUSTRIAL APPLICABILITY

By the method for processing an organic film according to the present invention, it is possible to completely remove a photo resist film, which has been deteriorated by high concentration ion implantation or by reactive ion etching and which has been difficult in the past to remove by a dry type processing to remove organic film or by a wet type processing using a solution containing sulfuric acid and hydrogen peroxide. This makes it possible to shorten the manufacturing process and to reduce percent defective in the manufacture of semiconductor devices.

What we claim is:

1. A method for removing an organic film from a substrate, the method comprising removing the organic film by subjecting the film to a gas containing oxygen plasma or ozone in a dry method or to a solution containing an oxidizing agent in a wet method, and thereafter immersing said substrate in an ozone processing tank containing a solution of ozone in ultra pure water, wherein said solution of ozone in ultra pure water is prepared by blowing ozone-containing gas having an ozone content of at least 10,000 ppm through ultra pure water and said ozone-containing gas contacts the organic film on the substrate in the form of gas bubbles.

2. A method for removing an organic film according to claim 1, wherein said oxidizing agent is a mixed solution of sulfuric acid and hydrogen peroxide.

3. A method for removing an organic film according to claim 1, wherein the organic film has been processed by reactive ion etching or ion implantation.

4. A method for removing an organic film according to claim 1, wherein the solution in the ozone processing tank is a heated solution.

* * * * *